United States Patent [19]

Bohan, Jr.

[11] Patent Number: 4,734,658

[45] Date of Patent: Mar. 29, 1988

[54] LOW VOLTAGE DRIVEN OSCILLATOR CIRCUIT

[75] Inventor: John E. Bohan, Jr., Minneapolis, Minn.

[73] Assignee: Honeywell Inc., Minneapolis, Minn.

[21] Appl. No.: 85,506

[22] Filed: Aug. 14, 1987

[51] Int. Cl.$^4$ ................................................ H03B 5/12
[52] U.S. Cl. ...................... 331/117 R; 331/117 FE; 331/66; 331/185
[58] Field of Search ........ 331/66, 70, 117 R, 117 FE, 331/167, 185

[56] References Cited

U.S. PATENT DOCUMENTS

| | | | |
|---|---|---|---|
| 2,985,846 | 5/1961 | Applegate | 331/112 |
| 2,988,709 | 6/1961 | Janssen | 331/112 |
| 3,299,369 | 1/1967 | Vercellotti | 331/112 |
| 3,313,954 | 4/1967 | Walker | 307/88.5 |
| 3,678,412 | 7/1972 | Spies | 331/112 |
| 4,015,609 | 4/1977 | Mensink et al. | 128/419 |
| 4,322,724 | 3/1982 | Grudzinski | 340/595 |
| 4,363,005 | 12/1982 | Kuroda et al. | 331/112 |
| 4,384,254 | 5/1983 | Brown | 324/253 |
| 4,696,639 | 9/1987 | Bohan, Jr. | 331/66 X |

*Primary Examiner*—Eugene R. LaRoche
*Assistant Examiner*—David Mis
*Attorney, Agent, or Firm*—Alfred N. Feldman

[57] ABSTRACT

An ultra low voltage energized oscillator for providing a stepped-up alternating current voltage is provided. This oscillator utilizes a field effect transistor with a high impedance network including a capacitor coupling a feedback signal from a secondary output winding to a primary input winding of a transformer.

5 Claims, 3 Drawing Figures

4,734,658

LOW VOLTAGE DRIVEN OSCILLATOR CIRCUIT

CROSS-REFERENCE TO RELATED APPLICATION

The present application is related to application Ser. No. 07/024,438 entitled "Status Indicator For Self-Energizing Burner Control System" which was filed on Mar. 11, 1987, by the present inventor and which is assigned to the assignee of the present invention. The invention was disclosed, but not claimed in the cross-referenced application.

BACKGROUND OF THE INVENTION

The cross-referenced application discloses a self-energizing burner control system in which a thermo electric generator means or Powerpile is exposed to a pilot burner and generates a very low level of direct current potential. This very low level of direct current potential is used to drive an oscillator means. The oscillator means provides an alternating current output which is stepped-up by a transformer. The output of the transformer, being higher in voltage than would ordinarily be available from a Powerpile, can be used with a rectifier and capacitor type of system to provide a direct current voltage of a high enough level to operate solid state electronics. This higher level direct current potential is then used to energize a very low power, solid state temperature control means.

SUMMARY OF THE INVENTION

The present invention is directed to a very low voltage driven oscillator circuit that is capable of reliably functioning at input or Powerpile voltages of 0.1 volts or less. The present oscillator is capable of operating at very low direct current potentials, and is useful in providing a stepped up alternating current voltage which can be rectified and supplied as a driving potential in the range of 3 to 15 volts for conventional solid state circuitry.

In accordance with the present invention, there is provided a low voltage driven oscillator circuit, including: transformer means having a first winding and a second winding with said windings magnetically coupled; solid state current control means having current conducting path means and further including current control electrode means; said current conducting path means and said first winding connected in a series circuit and said series circuit adapted to be connected to a source of low voltage, direct current potential; high impedance circuit means including connection means connecting said current control electrode to a first end of said second winding and to a first output conductor for said oscillator circuit; and common connection means connecting a second output conductor for said oscillator circuit to a second end of said second winding which in turn is connected to said solid state current control means.

DESCRIPTION OF THE PREFERRED EMBODIMENT

Figure 1:
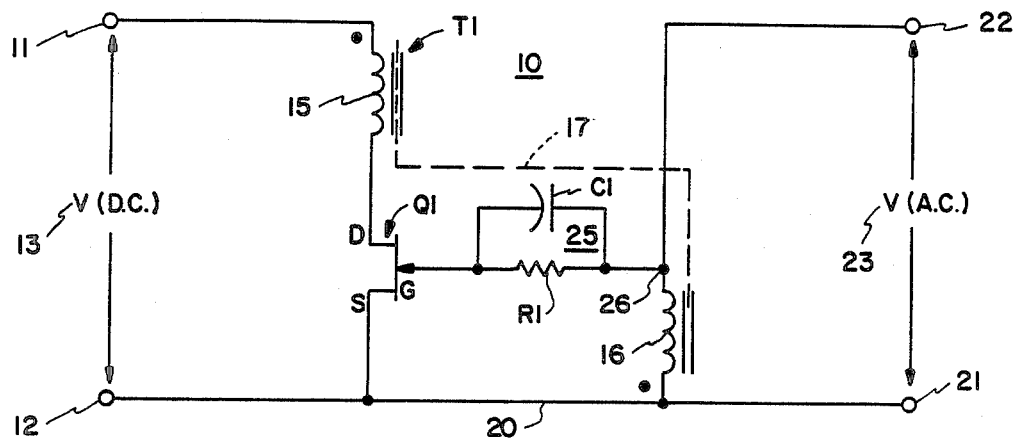
FIG. 1 is a schematic of a complete oscillator circuit.

In FIG. 1 the actual circuit of a low voltage driven oscillator 10 is disclosed. Pair of terminals 11 and 12 connect the oscillator 10 to a source of direct current voltage 13. The terminals 11 and 12 supply the direct current voltage 13 to a primary winding 15 of transformer T1 which is inductively coupled as shown at 17 to a secondary winding 16 of the transformer T1. The magnetic phasing of transformer T1 is shown in conventional form.

The primary winding 15 of transformer T1 is connected to a field effect transistor Q1. The transistor Q1 has a drain D, a source S, and a gate G. The drain D is connected to the primary transformer winding 15, while the sourse S is connected to a common conductor 20 for the overall circuit. The conductor 20 connects to terminal 12, as well as to an output terminal 21. A further output 22 is provided and an alternating voltage 23 is indicated as an output for the oscillator 10. The way in which the alternating current voltage 23 is generated will be described subsequently.

Connected to the gate G of the field effect transistor Q1 is a high impedance circuit means generally disclosed at 25, and made up of a parallel combination of a resistor R1 and a capacitor C1. The resistor $R^1$ is a relatively high ohmic resistance, while the capacitor C1 is small capacitor thereby providing the substantial impedance also. The high impedance circuit means 25 is connected at a node 26 to the secondary winding 16 of transformer T1. The other side of the transformer secondary 16 is connected to the conductor 20 and the terminal 21. The node 26 is directly connected to a terminal 22.

A detailed discussion of the operation of the oscillator 10 will be described subsequently, but it is sufficient at this point to indicate that the very low direct current voltage 13 is converted by the oscillator circuit 10 to a relatively high alternating current voltage 23. The low voltage 13 typically could be as 0.1 volts or less, or could range up to less than one volt in magnitude. The alternating current output voltage 23 is nominally 12 volts and, in this particular circuit, is in the range of 20 to 30 kilohertz.

The oscillator circuit 10 utilizes a transformer T1 with a turns ratio of 1 to 100, the field effect transistor Q1 is a type J110, the capacitor C1 is 100 picofarads, and the resistor $R^1$ is 10 megohms. These values are illustrative only of an actual oscillator circuit 10 that is used to convert a direct voltage 13 of a magnitude of up to approximately 0.75 volts from a Powerpile to an alternating current output voltage 23 that nominally is in the 12 volt range.

Figure 2:
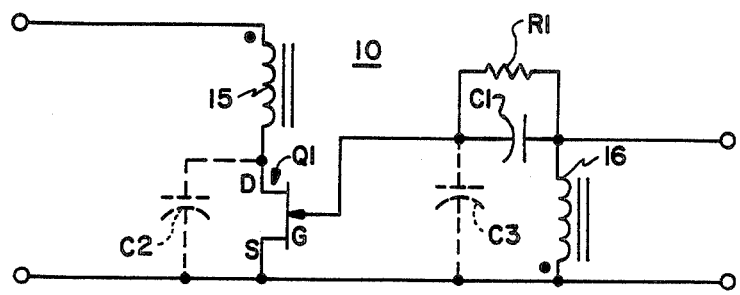
FIG. 2 is FIG. 1 with interelectrode capacitors shown.

In FIG. 2 the oscillator circuit 10 is disclosed along with a drain to source capacitance C2 of the field effect transistor Q1, and the gate to source capacitance C3 for the field effect transistor Q1. The capacitors C2 and C3 have been shown as they are inherently present in the structure of field effect transistor Q1. These elements were shown in order to provide a basis for a small signal equivalent circuit disclosed in FIG. 3.

Figure 3:
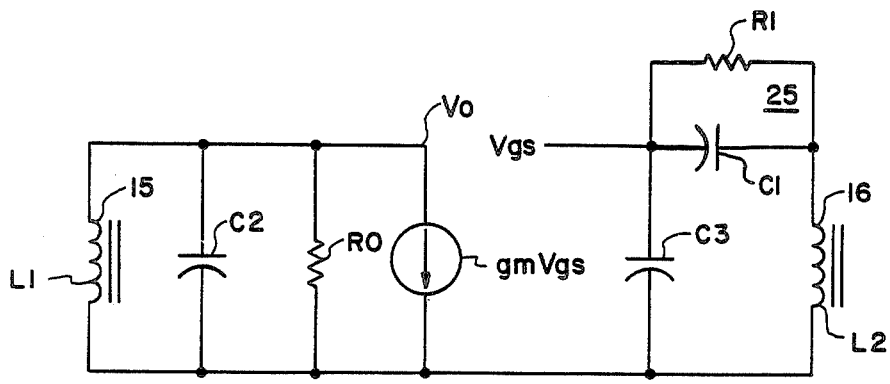
FIG. 3 is a small signal equivalent circuit of FIG. 1.

In FIG. 3 there is disclosed a small signal equivalent circuit for the oscillator circuit 10. The primary winding 15 is indicating as having an inductance L1 in parallel with the capacitor C2. The capacitor C2 is further in parallel with the resistance RO which is the on state resistance of the field effect transistor Q1. The current source indicated across resistor RO represents the gain of Q1 and has an output equivalent to the transconductance times the voltage from the gate to the source of Q1. The feedback, as shown in the small signal equivalent circuit is the voltage from the gate to the source of Q1 applied from capacitance C3 from the high impedance circuit means 25 from the secondary winding 16 of the transformer. Vo is a reference voltage which would be used in a mathematical analysis. A mathematical analysis of this small signal equivalent circuit will not be provided but is well understood by electronic engineers. This circuit provides for a complete analysis of the gain, frequency, currents, and voltages in the circuit and can be readily used to establish the parameters of the oscillator circuit 10.

OPERATION

The operation of the oscillator circuit 10 of FIG. 1 is herein provided. Small ambient noise voltage signals picked up at the gate G of Q1 are amplified by Q1, and increases or decreases the drain D to source S current flow in the field effect transistor Q1. These current changes induce a voltage in the primary 15 of the transformer T1. The transformer T1 then feeds back a signal to the gate G of the transistor Q1, via coupling capacitor C1, a signal 180 degrees out of phase with the original noise pulse. The field effect transistor Q1 further amplifies this signal and the transformer T1 again feeds back a phase shifted voltage to the gate G of the field effect transistor Q1. This amplification and feedback process quickly brings the oscillator circuit 10 to a steady state oscillating condition.

The frequency of oscillation is determined by the speed of the feedback loop. For this particular oscillator, the speed of the feedback is determined primarily by the inductance of the transformer T1 primary 15, the gate to source capacitance C3 of the field effect transistor Q1, and to a lesser extent the drain to source capacitance C2 of the field effect transistor Q1.

The purpose of the capacitor C1 is to couple the feedback from the secondary winding 16 without loosing power to the gate-drain, and to the gate source junctions of the field effect transistor Q1. If capacitance were not used, the maximum positive alternating voltage 23 would be 0.7 volts. Since that would not be practical, the coupling is necessary.

The purpose of the resistor R1 is to guarantee that the gate G of the field effect transistor Q1 is kept in the correct voltage range to sustain oscillations. If R1 were not used, C1 could develop a direct current bias sufficient to stop oscillations. In theory, R1 would not be needed, but in practice coupling capacitors do generally develop undesirable direct current bias voltages.

The present oscillator circuit 10 is an exceedingly simple oscillator circuit that is capable of operating at very low direct current voltage inputs. This makes the circuit particular adaptable for being powered from a thermocouple or Powerpile, and providing a stepped-up alternating current voltage output that can, inturn, be rectified and utilized as a power source for control of other electronic devices. This is exemplified in the cross reference application where a complete circuit utilizing this oscillator has been disclosed. The applicant wishes to be limited in the scope of his invention solely by the scope the appended claims.

The embodiments of the invention in which an exclusive property or right is claimed are defined as follows:

1. A low voltage driven oscillator circuit, including: transformer means having a first winding and a second winding with said windings magnetically coupled; solid state current control means having current conducting path means and further including current control electrode means; said current conducting path means and said first winding connected in a series circuit and said series circuit adapted to be connected to a source of low voltage, direct current potential; high impedance circuit means including connection means connecting said current control electrode to a first end of said second winding and to a first output conductor for said oscillator circuit; and common connection means connecting a second output conductor for said oscillator circuit to a second end of said second winding which in turn is connected to said solid state current control means.

2. A low voltage driven oscillator circuit as claimed in claim 1 wherein said transformer means is a two winding transformer; and said solid state current control means is a field effect transistor.

3. A low voltage driven oscillator circuit as claimed in claim 2 wherein said high impedance circuit means includes a capacitor.

4. A low voltage driven oscillator circuit as claimed in claim 3 wherein said high impedance circuit means is a parallel combination of said capacitor and a resistor of high ohmic value.

5. A low voltage driven oscillator circuit as claimed in claim 4 wherein said resistor is at least one megohm; and said source of low voltage, direct current potential is less than one volt.

* * * * *